US007265626B2

(12) United States Patent
Teo et al.

(10) Patent No.: US 7,265,626 B2
(45) Date of Patent: Sep. 4, 2007

(54) FAST-SETTING DIGITAL AUTOMATIC GAIN CONTROL

(75) Inventors: Chee Keong Teo, Signapore (SG); Lian-Chun Xu, Singapore (SG); Kok-Soon Yeo, Singapore (SG); John Julius Asuncion, Singapore (SG); Wai Keat Tai, Singapore (SG)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 92 days.

(21) Appl. No.: 11/312,089

(22) Filed: Dec. 20, 2005

(65) Prior Publication Data

US 2007/0139118 A1  Jun. 21, 2007

(51) Int. Cl.
*H03G 3/10* (2006.01)
(52) U.S. Cl. ...................................... 330/279; 330/254
(58) Field of Classification Search .................. 330/69, 330/279, 254, 260
See application file for complete search history.

(56) References Cited

U.S. PATENT DOCUMENTS

| 6,195,133 | B1 | 2/2001 | Bae | |
| 6,972,626 | B2 * | 12/2005 | Takahashi et al. | 330/279 |
| 6,977,550 | B2 * | 12/2005 | Ishida et al. | 330/279 |
| 7,015,759 | B2 * | 3/2006 | Ishida et al. | 330/279 |
| 7,183,845 | B2 * | 2/2007 | Dauphinee et al. | 330/129 |
| 2004/0259510 | A1 | 12/2004 | Audinot et al. | |

* cited by examiner

*Primary Examiner*—Henry Choe (57) ABSTRACT

A fast-settling digital automatic gain control circuit comprises first and second gain-controllable amplifiers in series. Each amplifier can be digitally switched between minimum and maximum gains by control logic that receives inputs from a multi-level voltage comparator. A peak detector connected to the output of the first gain-controlled amplifier is used to set the overall operating ranges for several threshold detectors. Four reference voltages are generated from the peak detector. The highest reference voltage is used to clock and reset the gain control logic with a hysteresis comparator to the instantaneous input signal from the first gain-controlled amplifier. The three other lower reference voltages are used to provide three-bits of digital input data to the gain control logic. Two digital controls are output, a min/max gain bit for the first gain-controlled amplifier, and a similar min/max gain bit for the second gain-controlled amplifier.

14 Claims, 5 Drawing Sheets

FAST-SETTING DIGITAL AUTOMATIC GAIN CONTROL

BACKGROUND OF THE INVENTION

Analog and video sources can vary widely in the signal amplitudes they produce. Receivers and input amplifier circuits, however, are limited in the ranges of voltages and currents they can process. So a strong input signal in the first stages of amplification with the gain set too high can result in saturation and clipping, the output will therefore be highly distorted and not very useful. Too little amplification on a faint signal may also produce an output that is not useful.

Automatic gain control (AGC) circuits were first widely used in television and radio receivers where the channels being tuned can vary widely in strength. AGC allows the audio volumes and video contrasts to be presented at consistent levels. Audio AGC has also been employed recently to maintain a consistent volume between programs and commercials, and in Internet telephony applications. Originally, purely analog AGC methods were used, but now digital circuits allow the implementation of digital automatic gain control (DAGC).

Jum-Han Bae in U.S. Pat. No. 6,195,133, issued Feb. 27, 2001, and Pascal Audinot, et al., in U.S. patent application Ser. No. US 2004/0259510, published Dec. 23, 2004, describe DAGC implementations that necessitate or involve the use of A/D converters. A/D converters tend to increase the costs and increase AGC settling times. While an AGC circuit hunts for the right level and the controlled amplifiers settle in to these new levels, the signal outputs can be distorted or otherwise useless, and such will limit the applications for which the AGC circuit can be employed.

In view of this, what is needed is a DAGC system that is simple, inexpensive to manufacture, and that settles quickly.

SUMMARY OF THE INVENTION

A fast-settling digital automatic gain control circuit/cell comprises first and second gain-controllable amplifiers in series. Each amplifier can be digitally switched between minimum and maximum gains by control logic that receives inputs from a multi-level voltage comparator. A peak detector connected to the output of the first gain-controlled amplifier is used to set the overall operating ranges for several threshold detectors. Four reference voltages are generated from the peak detector. The highest reference voltage is used to clock the gain control logic with a hysteresis comparator to the instantaneous input signal from the first gain-controlled amplifier. The three other lower reference voltages are used with three more hysteresis comparators to provide three-bits of digital input data to the gain control logic. Two digital controls are output, a min/max gain bit for the first gain-controlled amplifier and a similar min/max gain bit for the second gain-controlled amplifier. Other embodiments may utilize additional gain-control stages and more gain control bits if the gain control logic is made appropriately more complex.

Alternative embodiments of the present invention may include two or more similar digital automatic gain control circuit/cell to cascade in series to have more control bits and gain stages. Many other aspects and advantages of the present invention will become apparent from the following detailed description, taken in conjunction with the accompanying drawings, illustrated by way of example of the principles of the invention.

DETAILED DESCRIPTION

Figure 1:
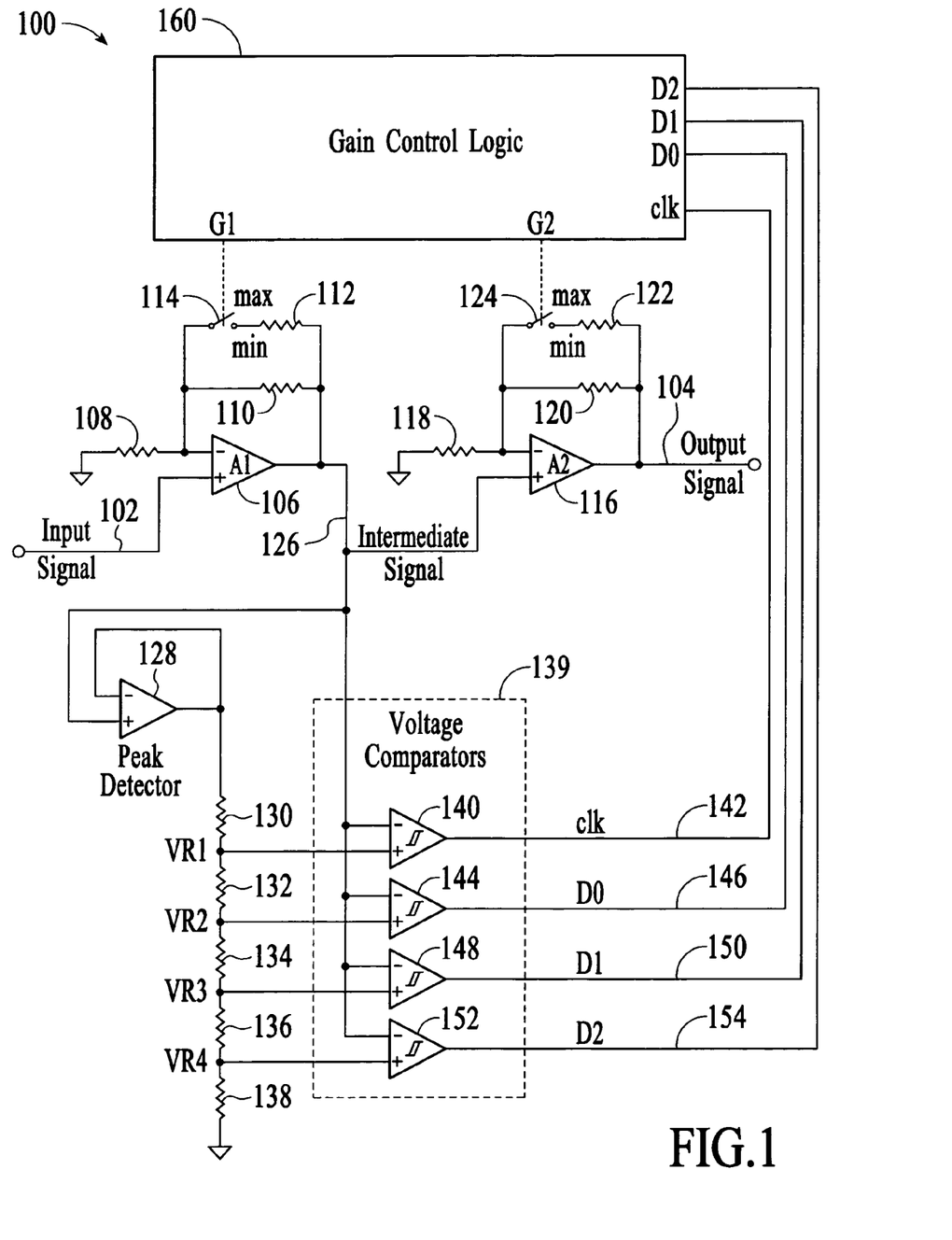
FIG. 1 is a schematic diagram of a fast-settling digital automatic gain control circuit embodiment of the present invention.

FIG. 1 represents a fast-settling digital automatic gain control (DAGC) circuit embodiment of the present invention, and is referred to herein by the general reference numeral 100. The DAGC circuit 100 comprises a raw input signal 102 that is AGC-amplified to produce a signal output 104. For example, the circuit 100 can comprise the front-end of an optical fiber channel receiver. Input signal 102 can be the output of a transimpedance amplifier which converted the received photo current from a PIN-photodiode to voltage signal and the output signal 104 can be provided to a quantizer. The DAGC circuit 100 has two stages, the first stage comprises a primary amplifier (A1) 106 that has its inverting input connected to ground by a resistor 108 and a fixed feedback resistor 110. In one example, primary amplifier 106 can be a low-noise transimpedance (TZ) type like an Analog Devices ADN2882.

The ratio of resistor 110 to resistor 108 determines the maximum gain. Input signal 102 is provided to the non-inverting (+) amplifier input. A switchable resistor 112 and an analog switch 114 can be switched-on with control G1 to lower the gain of primary amplifier 106 to its minimum. The respective ratios can be selected for appropriate min/max gains according to particular applications. Mathematically, $$\text{Gain-max} = \frac{R110 + R108}{R108}$$

and, $$\text{Gain-min} = \frac{\left(\frac{R110 * R112}{R110 + R112}\right) + R108}{R108}.$$

The secondary stage of DAGC circuit 100 comprises a secondary amplifier (A2) 116 with its inverting input connected to ground by a resistor 118 and a fixed feedback resistor 120. Here, the ratio of resistor 120 to resistor 118 determines the maximum gain. An intermediate signal 126 is provided to the non-inverting (+) amplifier input. A switchable resistor 122 and an analog switch 124 can be switched-on with control G2 to lower the gain of secondary amplifier 116 to its minimum. The respective ratios can be selected for appropriate min/max gains according to particular applications, and can be set differently than for the first stage. E.g., a binary gain weighting of 1-2-4-8 would be advantageous. Mathematically the post-amplifier gains will be, $$\text{Gain-max} = \frac{R120 + R118}{R118}$$

and, $$\text{Gain-min} = \frac{\left(\frac{R120 * R122}{R120 + R122}\right) + R118}{R118}.$$

The intermediate signal 126 is sampled by a peak detector 128 which holds the peak value of any voltage output by primary amplifier 106. A voltage divider is setup by resistors 130-138. Four reference voltage taps VR1-VR4 are provided for threshold comparators, e.g., at 2%, 5%, 10%, and 20% of the detected peak input signal voltage. A multi-level voltage comparator 139 uses the reference voltage taps VR1-VR4 to generate clock and gain control logic data.

Within multi-level voltage comparator 139, the highest reference voltage VR1 is compared to the input signal by a clock generator 140 to produce a clock (clk) signal 142. Clock generator 140 is implemented here with a hysteresis comparator. The second highest reference voltage VR2 is used by a hysteresis comparator 144 to produce a gain control logic signal (D0) 146. The third highest reference voltage VR3 is used by a hysteresis comparator 148 to produce a gain control logic signal (D1) 150. The lowest reference voltage VR4 is used by a hysteresis comparator 152 to produce a gain control logic signal (D2) 154. Such digital outputs are connected to a gain control logic 160. The signal timing is shown in FIG. 2.

For simplicity of illustration, the gain of primary amplifier 106 and secondary amplifier 116 are limited to two gain levels, min/max. Many more levels of gain are possible, depending on how much circuit complexity can be tolerated.

In the present example of FIG. 1, the default gain for both primary and secondary amplifiers are G1 max, and G2 max, respectively. These values allow for a smallest possible input signal. As such, there will be a total of four state combinations for G1-G2, e.g., max-max, max-min, min-max and min-min. More states/levels can be implemented at each gain stage to increase the resolution to the gain switch each time the gain jumps.

Figure 2:
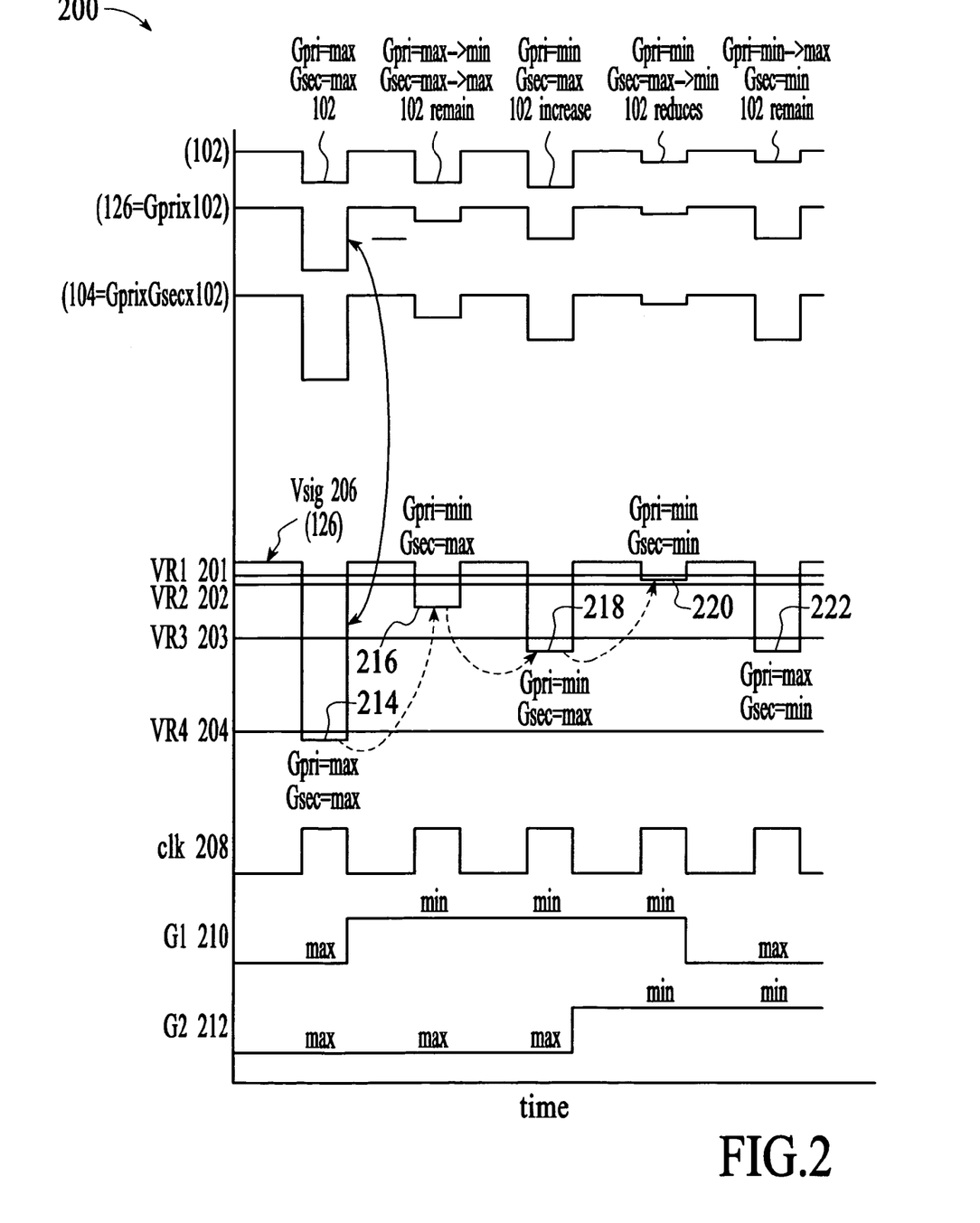
FIG. 2 is a timing diagram showing how the gain control logic uses various voltage reference thresholds to generate clocks, input data and gain controls.

FIG. 2 illustrates the primary and secondary gain switching when signal 126 (FIG. 1) crosses the four reference levels (VR1) 201, (VR2) 202, (VR3) 203, and (VR4) 204. Reference level VR1 is used only to generate a gating clock (clk) 208. Gain command (G1) 210 controls the primary amplifier, and gain command (G2) 212 controls the secondary. G1 210 and G2 212 are updated only on the falling edge of the gating clock 208.

In one example for discussion here, voltage references are assumed to be VR2=5%, VR3=10% and VR4=20% of the peak input signal. For a primary amplifier like amplifier 106 with variable gain A1, and where signal 126=S, the G1 gain will be switched as follows:

When S<VR2=5%, set A1=Max (G1=LOW);
When 5%<S<20%, A1 keeps its previous state; and
When S>VR4=20%, set A1=Min (G1=HIGH).

Likewise, for a secondary amplifier like amplifier 116 with a variable gain A2, and where signal 126=S, the G2 gain will be switched as follows: If primary amplifier 106 switches, secondary amplifier 116 is kept at its previous state; Otherwise, if S>VR3=10%, set A2=Min (G2=HIGH), or if S<VR3=10%, set A2=Max (G2=LOW).

The switching mechanism of secondary amplifier 116 is such that if primary amplifier 106 switches, its gain will not be adjusted. This allows a later second evaluation of whether a previous change in gain in primary amplifier 106 was sufficient for AGC purposes.

Considering FIG. 1 for example, if the output signal 104 should range 10% to 80% for an input range of 0.05% to 8%, then the A1 maximum gain should be 20×, and the A1 minimum gain should be 2.5×. The maximum A2 gain should be 8×, with a A2 minimum gain of 4×. The voltage references should be chosen to be VR2=5%, VR3=10% and VR4=20% of the peak input signal. Therefore in operation, when the input signal at 102 is 6%, the amplifier 106 is initially at its maximum gain of 20×. The intermediate node 126 will be at 20*6%, or 120%. But node 126 can only reach 100% due to saturation. The feedback gain control logic 160 will switch the A1 gain of the amplifier 106 to minimum, e.g., 2.5×. The A2 gain of the amplifier 116 is not allowed to change. The resulting signal at the intermediate node 126 is 2.5*6%, or 15%. Such is less than 20%. In the next clock cycle, the A1 gain of the amplifier 106 will not change because the signal 126 is between VR2 (5%) and VR4 (20%). The feed-forward gain control logic 160 will switch the A2 gain of amplifier 116 from its maximum of 8×, to its minimum of 4×. This because the signal 126 (20%) is higher than 10%. The result is output signal 104 goes to 15*4%, or 60%.

For input signal 102 ranges from 0.05% to 1%, the A1 gain of the amplifier 106 will be maximum, the intermediate signal 126 will be 1% to 20%. For input signal 102 range from 1% to 8%, the A1 gain of the amplifier 106 is at minimum, so the intermediate signal 126 range will be 2.5% to 20%. The output signal 104 will range 10% and 80%.

FIG. 2 illustrates the relative signal timing. At the start, G1 210(Gpri) and G2 212(Gsec) both default to LOW(max gain) so that a minimum signal at 102 (Vsig 206=102×G1) will be detectable. When an input signal Vsig 206 changes to a level 214 below VR4, and G1 and G2 are at max gain, then gain control G1 210 will clock HIGH. Gain control G2 212 is not allowed to change. This causes Vsig 206 to change to a next level 216, e.g., between VR2 and VR3. At level 216, gain control G1 210 will not need to change. But gain control G2 212 will not be allowed to change since G1=max to min just occurred in the previous clock. So both G1 210 and G2 212 will stay put. A change from level 216 to 218 results from input signal 102 even with the G1=min and G2=max kept the same. Gain control G1 210 remains because level 218 falls between VR2 and VR4. Gain control G2 212 will clock HIGH(min) since level 218 is greater than VR3. The change in gain control G2=max to min will not affect Vsig 206 (Vsig 206=102×G1). But this time, input signal 102 reduces again, resulting Vsig 206 change from a level 218 to a level 220. At level 220, the G1 210 will clock LOW(max), since level 220 is less than VR2. Gain control G2 212 stays put since level 220 is outside of VR2 to VR4. With G1=min to max, Vsig 206 assumes level 222 which is within the range of VR2 to VR4). On the next clock G2 212 will not change, but a subsequent clocking of G2 212 will start the compare again.

In Table I, signal D0 146 represents the 5% threshold, and signal D2 154 represents the 20% threshold. In Table II, the secondary amplifier is switched according to what has occurred in the primary amplifier gain settings, and D1 150 is the 10% threshold.

TABLE I

Truth Table for Generating G1

| D0 146 | D2 154 | prior G1 | new G1 | remarks input signal %, G1 gain |
|---|---|---|---|---|
| 0 | 0 | 0 | 0 | under 5%, G1 LOW (max) |
| 0 | 0 | 1 | 0 | under 5%, G1 LOW (max) |
| 1 | 0 | 0 | 0 | between 5% and 20%, G1 no-change |
| 1 | 0 | 1 | 1 | between 5% and 20%, G1 no-change |
| 1 | 1 | 0 | 1 | over 20%, G1 HIGH (min) |
| 1 | 1 | 1 | 1 | over 20%, G1 HIGH (min) |

TABLE II

Truth Table for Generating G2

| prior G1 | new G1 | prior D1 150 | new D1 150 | new G2 | remarks input signal %, G2 gain |
|---|---|---|---|---|---|
| 0 | 0 | 0 | 0 | 0 | under 10% G2 LOW, gain max |
| 0 | 0 | 0 | 1 | 1 | over 10% G2 HIGH, gain min |
| 0 | 0 | 1 | 0 | 0 | under 10% G2 LOW, gain max |
| 0 | 0 | 1 | 1 | 1 | over 10% G2 HIGH, gain min |
| 0 | 1 | 0 | 0 | 0 | under 10% G2 LOW, gain max |
| 0 | 1 | 0 | 1 | 0 | over 10% G2 LOW, gain max |
| 0 | 1 | 1 | 0 | 1 | under 10% G2 HIGH, gain min |
| 0 | 1 | 1 | 1 | 1 | over 10% G2 HIGH, gain min |
| 1 | 0 | 0 | 0 | 0 | under 10% G2 LOW, gain max |
| 1 | 0 | 0 | 1 | 1 | over 10% G2 HIGH, gain min |
| 1 | 0 | 1 | 0 | 1 | under 10% G2 LOW, gain max |
| 1 | 0 | 1 | 1 | 1 | over 10% G2 HIGH, gain min |
| 1 | 1 | 0 | 0 | 0 | under 10% G2 LOW, gain max |
| 1 | 1 | 0 | 1 | 1 | over 10% G2 HIGH, gain min |
| 1 | 1 | 1 | 0 | 0 | under 10% G2 LOW, gain max |
| 1 | 1 | 1 | 1 | 1 | over 10% G2 HIGH, gain min |

Figure 3:
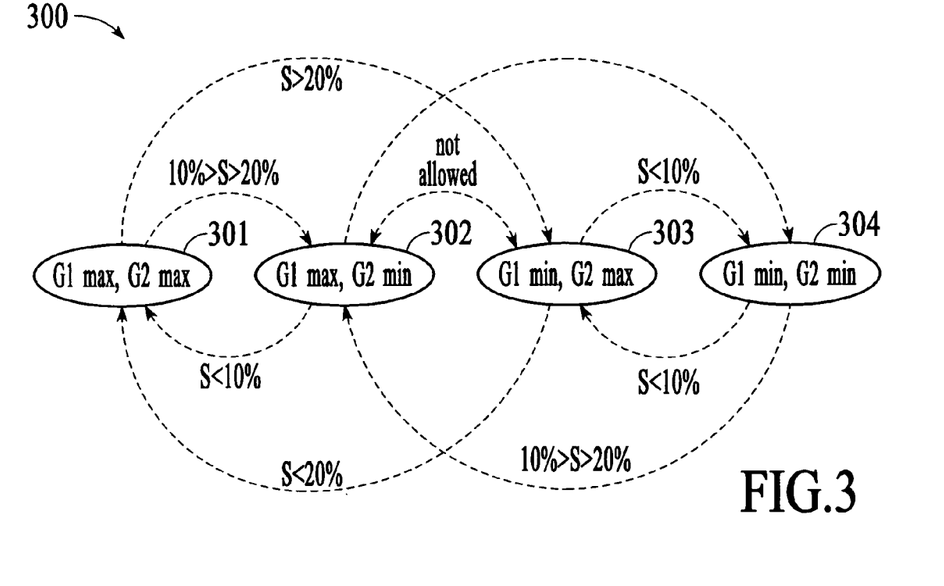
FIG. 3 is a state diagram showing the permitted changes in states for gain controls G1 and G2 in FIGS. 1 and 2.

FIG. 3 is a state diagram 300 that maps the states for two programmable amplifiers that each have two possible gain settings, e.g., min/max. Four states 301-304 are possible for max-max 301, max-min 302, min-max 303, and min-min 304. The only prohibition between changing states is moving between max-min 302 and min-max 303, because that would require both amplifiers to alternate their gain settings. The general rule is that if G1 has changed, then G2 cannot be changed.

Assuming an initial state of max-max 301, if the input signal is very strong, e.g., greater than 20% of reference, G1 for the primary amplifier 106 is changed from max to min, min-max state 303. G2 for the secondary amplifier 116 is not changed. The gain will change from max-max 301 to min-max 303 directly, and skip over the max-min state 302. If the signal is still too strong, the gain will be changed in a second subsequent step to min-min state 304.

Going the other way, if the signal suddenly drops off, the gain can be switched from the min-min state 304 directly to the max-min state 302, e.g., jumping over min-max state 303. If that was not enough, a second subsequent step to max-max state 301 is allowed. The maximum number of steps needed to reach an optimum gain level is two, no matter how much the input signal strength changes. This makes for more efficient system settling, compared to conventional step-to-step switching.

For primary and secondary amplifiers with more that two selectable gain levels, the number of steps needed to reach the optimum level will be proportionally increased. If there is no clock signal 142 for a predefined time, the gain of the system will be reset to the max-max state 301 by the gain control logic 160.

Figure 4:
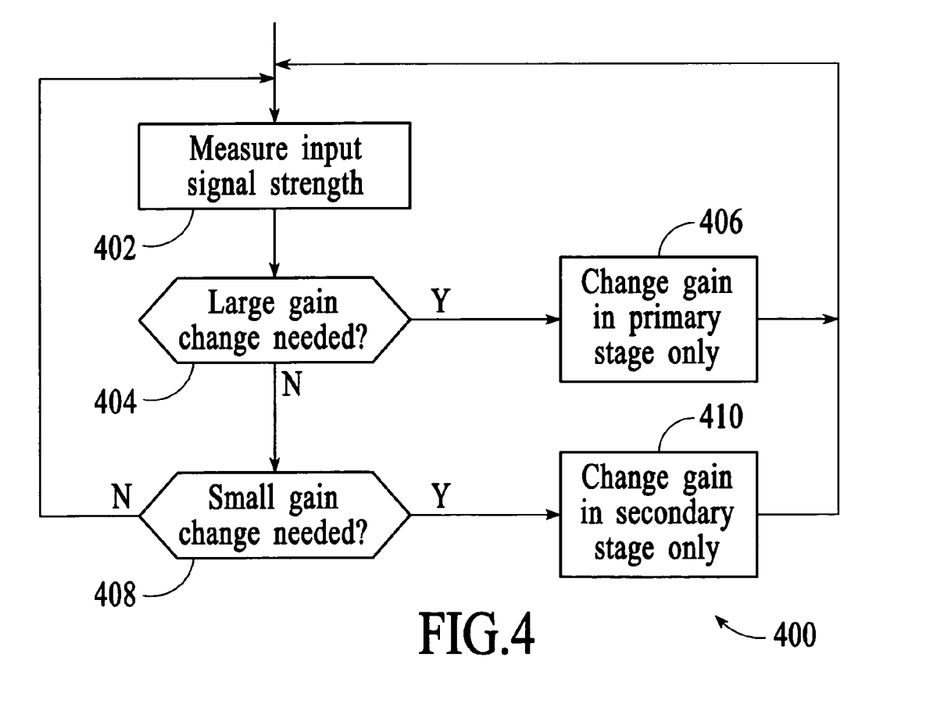
FIG. 4 is a flowchart diagram of a digital automatic gain control method embodiment of the present invention.

FIG. 4 represents a digital automatic gain control method embodiment of the present invention, and is referred to herein as method 400. The gain contributions of the various stages are made different, so changing one stage versus another can be preferred when it would result in a new overall AGC response closer to ideal. The method 400 can be applied to the DAGC circuit 100 of FIG. 1, and comprises measuring an input signal's peak amplitude, block 402. At decision point 404, a percentage of the peak amplitude measurement is used to decide if a large step-change in gain is needed. If so, at block 406 a primary stage provides gain changes in larger steps than those in a secondary stage. Block 406 also only permits the primary stage's gain to be changed on the present cycle. Large reductions in overall gain require the primary stage to be switched, rather than continuously varied, e.g., with two steps from max to min, e.g., max-max state 301, or max-min state 302, to min-min state 304, as in FIG. 3. Large increases in overall gain require the primary stage to be switched from min to max, e.g., min-max state 303, or min-min state 304, to max-max state 301, in FIG. 3.

At decision point 408, a different percentage of such peak amplitude measurement is used to decide if a small step-change in gain is needed. If so, at block 410 a primary stage provides larger gain changes than those in a secondary stage. Block 410 also only permits the secondary stage's gain to be changed. Small reductions in overall gain require the secondary stage to be switched from max to min, e.g., max-max state 301 to max-min state 302, or min-max state 303 to min-min state 304, in FIG. 3. Small increases in overall gain require the secondary stage to be switched from max to min, e.g., min-min state 304 to min-max state 303, or max-min state 302 to max-max state 301, in FIG. 3.

The functions described at decision points 406 and 410 allow only one of the selectable-gain amplifiers to change gain in each time period, for example, by not permitting a selectable-gain amplifier to change its gain setting if an earlier stage has already changed its setting in a current time period. The time s periods can be clocked by detecting changes in the input signal itself, as by comparator 140 in FIG. 1, or by a system clock. A reset timer should be included to reset the gain to max-max state 301 after a predetermined period of inactivity.

Method 400 illustrates a two-stage, two-gain setting for each stage. More stages and/or more than two gain settings per stage can be used. The common feature between all embodiments of the present invention is that at least two stages are used, each stage has at least two switchable gain settings, the earlier stages are switched first and the later stages only if its preceding stage has not switched in a current AGC update cycle, and the gains in each stage are arrived at directly rather than approached incrementally. If, for example, an optical receiver comprised a transimpedance pre-amplifier and a following post amplifier before a digital quantizer, and each amplifier had three gain settings, then a DAGC embodiment of the present invention would use three steps maximum before arriving at the optimal overall gain setting.

Figure 5:
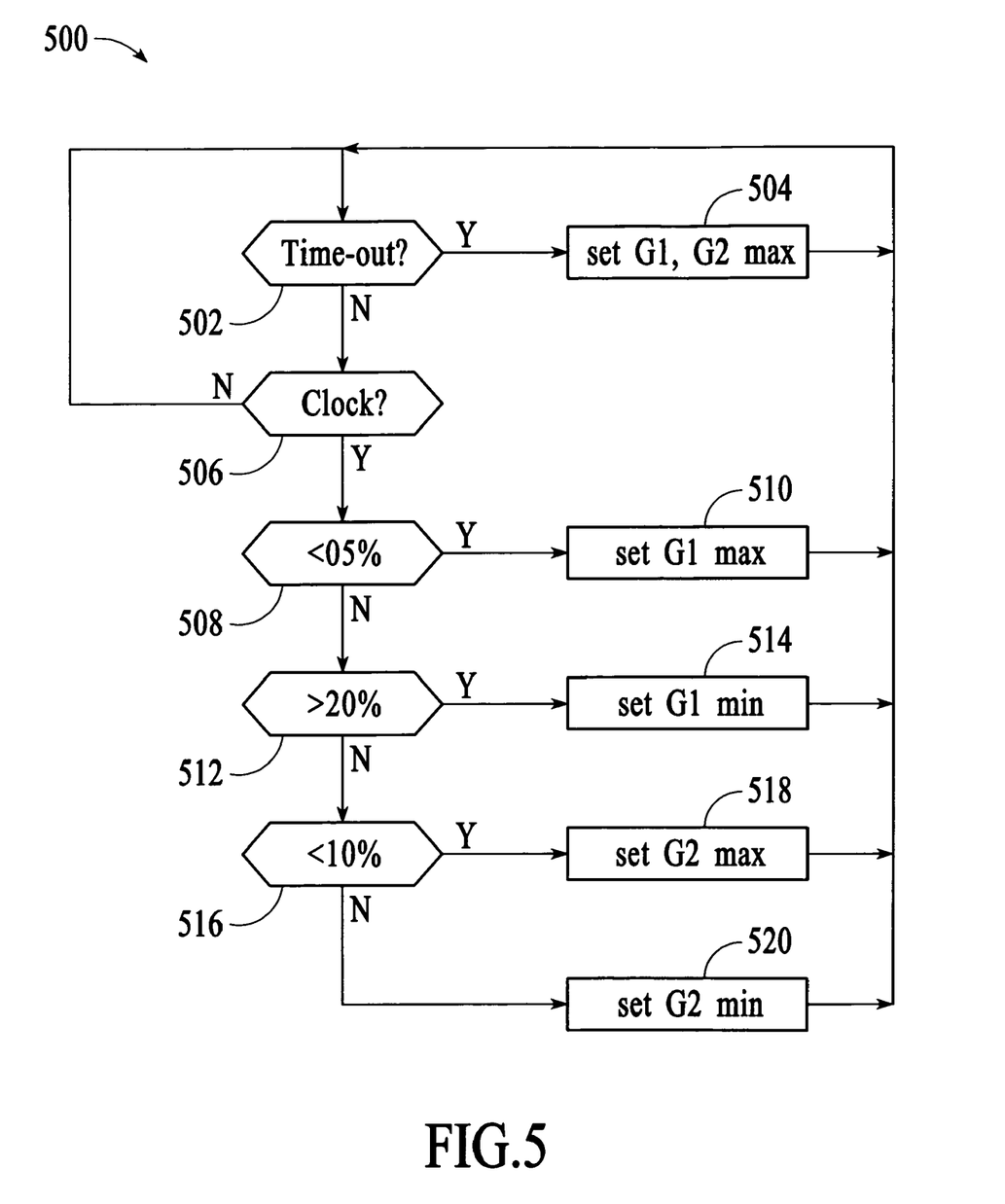
FIG. 5 is a flowchart diagram of another digital automatic gain control method embodiment of the present invention.

FIG. 5 represents another method embodiment of the present invention, and is referred to herein by the general reference numeral 500. Method 500 operates on a circuit with two stages of two-level gain control, e.g., circuit 100, FIG. 1. It assumes the same threshold points of 5%-10%-

20%. More stages of control, and more levels of control in each stage would require respectively more threshold points. The case in FIG. 5 is limited to two stages of two-level gain control herein to simplify this explanation only. At decision point 502 a test is made to see if too much time has passed since the last gain adjustment. Since the circuit 100 uses the signal itself to produce clocks, it can happen that too low a signal level will not allow the gain for the two stages to be advanced to the max-max condition. If so, at block 504, gains G1-G2 are set to max-max. At decision point 506 a test is made to keep the control loop from racing. A time clock can be used to pace regular AGC updates. At decision point 508 a test is made to see if the input signal strength is less than 5%. If so, at block 510 the G1 gain is set to max, and the G2 gain is not disturbed. At decision point 512, the input signal strength is tested for being greater than 20%. If so, at block 514 the G1 gain is set to min, and again the G2 gain is not disturbed. If a large change is not needed, e.g., the previous setting of G1 was appropriate, a decision point 516 is reached. It tests to see if the input signal strength is under 10%. If so, at block 518, G2 is set to max. Otherwise, at block 520, G2 is set to min. In any of blocks 504, 510, 514, 518, and 520, the setting of G1 or G2 to max or min may not represent a change. In other words, the update gain setting confirms and continues the previous gain settings.

Figure 6:
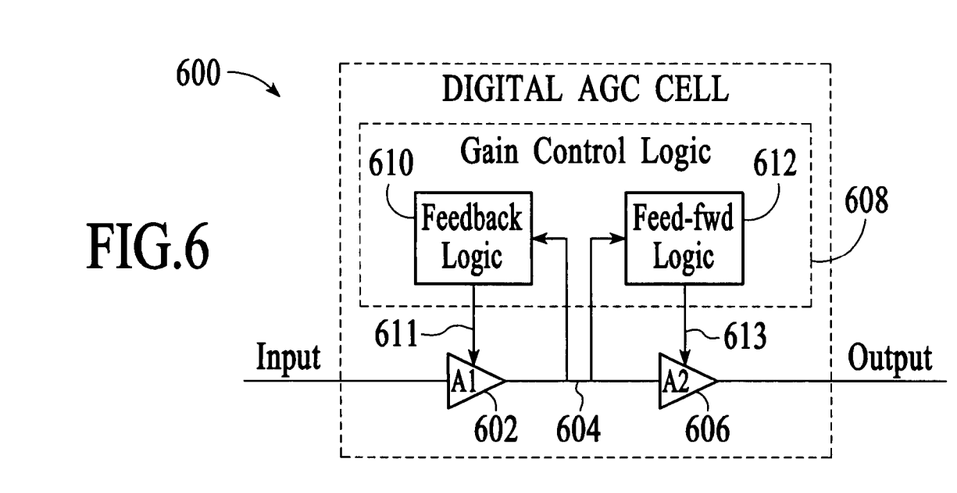
FIG. 6 is a functional block diagram of a single fast-settling digital automatic gain circuit/cell of the present invention.

The circuit of FIG. 1 is simplified here in FIG. 6. A single fast-settling digital automatic gain control (DAGC) cell embodiment of the present invention, is referred to herein by the general reference numeral 600. The DAGC cell 600 comprises a primary amplifier 602 with a variable gain A1. It has a intermediate node connection 604 at its output to the input of a secondary amplifier 606 with a variable gain A2. Gains A1 and A2 are independently variable by a gain control logic 608. At the simplest implementation, there are two gains levels possible for each of A1 and A2, e.g., maximum and minimum. A feedback logic 610 provides a G1 control signal 611, and a feed-forward logic 612 produces a second G2 gain control signal 613.

The gain of amplifier 602 is controlled by a feedback control loop. In terms of FIG. 1, such feedback uses signals D0 and D2 from comparators 144 and 152. The gain of amplifier 606 is controlled differently, e.g., by a feed-forward control loop. The feed-forward signal corresponds to signal D1 from comparator 148 in FIG. 1.

Figure 7:
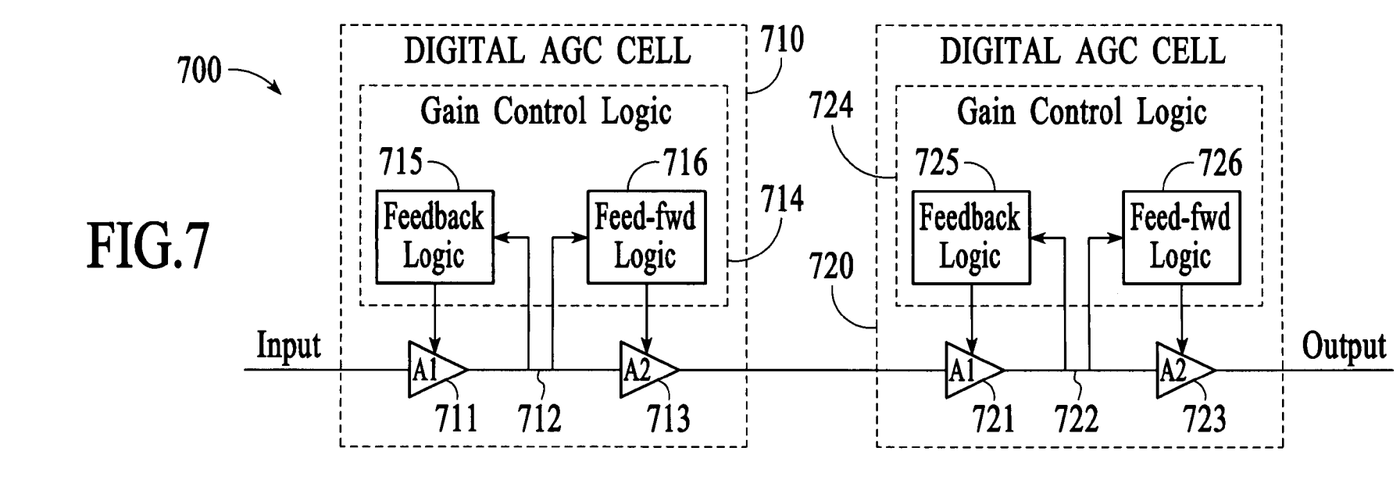
FIG. 7 is a functional block diagram showing how two fast-settling digital automatic gain circuits/cells can be connected in series for a large multi-stage AGC circuit with more control bits.

FIG. 7 illustrates how a two-cell fast-settling digital automatic gain control 700 can be connected to have a larger gain control and with more control bits. A first DAGC cell 710 resembles that in FIG. 6 and comprises a first amplifier 711, an intermediate node 712 for feedback and feed-forward, and a second amplifier 713. A gain control logic 714 comprises feedback logic 715 and feed-forward logic 716. Its output is connected to a second DAGC cell 720. DAGC cell can have different gains and control thresholds compared to DAGC cell 710. It comprises a first amplifier 721, an intermediate node 722 for feedback and feed-forward, and a second amplifier 723. A gain control logic 724 comprises feedback logic 725 and feed-forward logic 726.

Other embodiments of the fast-settling digital automatic gain control circuit are possible. In general, digital automatic gain control embodiments of the present invention use some percentage of a signal's peak amplitude to decide whether to switch an input amplifier or a following amplifier between respective, different, fixed gains. The gain contributions of the various stages are made different, so changing one stage versus another can be preferred when it would be closer to ideal. Only one selectable-gain amplifier is allowed to have its gain setting changed each clock period. One way to implement that would be by not permitting a selectable-gain amplifier to change its gain setting if an earlier stage has changed its setting in the current clock period.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A circuit, comprising:
    a plurality of gain-controllable amplifiers, wherein each amplifier can be digitally and independently switched between a plurality of gains stepped between a minimum and a maximum gain, and providing for a corresponding plurality of discrete gain states;
    a gain control logic connected to select between the respective gains of the gain-controllable amplifiers, and providing for a single such gain-controllable amplifier to be adjusted in a single time period;
    a multi-level voltage comparator for sampling the strength of an input signal, and connected to provide the gain control logic with digitized signal amplitude data obtained by comparing a plurality of voltage reference thresholds divided from a peak reference voltage;
    a peak detector connected to sample said input signal and to generate there from said peak reference voltage; and
    a clock generator for pacing the gain control logic to issue updates of said plurality of gains at one gain-controllable amplifier per clock.

2. The circuit of claim 1, wherein the multi-level voltage comparator and the gain control logic together provide for:
    setting a primary gain-controllable amplifier to a discrete maximum gain if said input signal is less than a first prescribed level;
    setting said primary gain-controllable amplifier to a discrete minimum gain if said input signal is more than a second prescribed level;
    setting a secondary gain-controllable amplifier to a discrete maximum gain if said input signal is less than a third prescribed level; and
    setting said primary gain-controllable amplifier to a discrete minimum gain if said input signal is more than a fourth prescribed level.

3. The circuit of claim 1, further comprising:
    a first and second amplifier providing for a primary and secondary stage of gain-controllable amplification;
    wherein, each first and second amplifier is respectively connected to a first fixed-value feedback resistor providing for a maximum gain setting;
    wherein, each first and second amplifier is further correspondingly connected a second fixed-value feedback resistor in series with an analog switch, both in parallel with the first fixed value feedback resistor, and that together provide for a minimum gain setting; and
    wherein the gain control logic is connected to independently control each analog switch.

4. The circuit of claim 3, wherein:
    the gain control logic allows four gain control states for the first and second amplifiers of max-max, max-min, min-max, and min-min.

5. The circuit of claim 4, wherein:
    the gain control logic prohibits direct transitions between said max-min and min-max gain control states for the first and second amplifiers.

6. The circuit of claim 1, wherein:

the clock generator comprises a comparator connected to receive a percentage of said peak reference voltage for comparison with said input signal.

7. The circuit of claim 6, wherein:

the gain control logic allows four gain control states for the first and second amplifiers of max-max, max-min, min-max, and min-min;

the gain control logic prohibits direct transitions between said max-min and min-max gain control states for the first and second amplifiers; and the gain control logic will reset to a max-max gain control state if the clock generator has not issued a clock pulse for a predetermined time.

8. The circuit of claim 1, further comprising:

a trans-impedance amplifier providing for a primary stage of gain-controllable amplification;

a first fixed-value feedback resistor connected to the trans-impedance amplifier and providing for a maximum gain setting; and a second fixed-value feedback resistor in series with an analog switch, both in parallel with the first fixed value feedback resistor, and connected to the trans-impedance amplifier and providing for a minimum gain setting;

wherein the gain control logic is connected to the analog switch.

9. A digital automatic gain control (DAGC) cell, comprising:

first and second gain-controllable amplifiers, wherein each amplifier can be digitally and independently switched between its minimum and maximum gain, providing for four gain states of max-max, max-min, min-max, and min-min;

a feedback gain control logic and a feed-forward gain control logic connected to select between the respective gains of the first and second gain-controllable amplifiers, and providing for only one such gain-controllable amplifier to be adjusted in a single time period; and a multi-level voltage comparator for sampling an input signal strength, and connected to provide to the feedback and feed-forward gain control logics a digitized weighted signal amplitude data obtained by comparing a plurality of voltage reference thresholds divided from a peak detector connected to sample said input signal strength.

10. A digital automatic gain control method, comprising:

arranging primary and secondary gain-controllable amplifiers with at least two gain settings each, and operated in series, and together for receiving an input signal having a dynamic range large enough to necessitate automatic gain control;

periodically measuring said input signal's peak amplitude for comparison with said input signal's present amplitude;

selecting amongst the gain settings of said primary gain-controllable amplifier if said comparison indicates a relatively large change in gain is desired; and selecting amongst the gain settings of said secondary gain-controllable amplifier if said comparison indicates a small change in gain is desired, but only if the gain settings of said primary gain-controllable amplifier are not also being currently changed.

11. The method of claim 10, further comprising:

resetting all gain-controllable amplifiers to maximum gain if a predetermined period of time has passed with no other updates.

12. The method of claim 11, further comprising:

setting said primary gain-controllable amplifier to a discrete maximum gain if said input signal is less than a first prescribed level; and setting said primary gain-controllable amplifier to a discrete minimum gain if said input signal is more than a second prescribed level.

13. The method of claim 12, further comprising:

setting said secondary gain-controllable amplifier to a discrete maximum gain if said input signal is less than a third prescribed level; and setting said primary gain-controllable amplifier to a discrete minimum gain if said input signal is more than a fourth prescribed level.

14. The method of claim 13, wherein:

the setting is such that said discrete minimum and maximum gains of said primary gain-controllable amplifier have a greater overall gain effect than do said discrete minimum and maximum gains of said secondary gain-controllable amplifier; and the setting of said secondary gain-controllable amplifier is skipped if said input signal is less than said first prescribed level, or more than said second prescribed level.

* * * * *